United States Patent
Watanabe

(10) Patent No.: US 8,383,497 B2
(45) Date of Patent: Feb. 26, 2013

(54) METHOD FOR MANUFACTURING SOLID-STATE IMAGE SENSOR

(75) Inventor: Takanori Watanabe, Yamato (JP)

(73) Assignee: Canon Kabushiki Kaisha, Tokyo (JP)

( * ) Notice: Subject to any disclaimer, the term of this patent is extended or adjusted under 35 U.S.C. 154(b) by 97 days.

(21) Appl. No.: 13/088,465

(22) Filed: Apr. 18, 2011

(65) Prior Publication Data

US 2011/0281392 A1    Nov. 17, 2011

(30) Foreign Application Priority Data

May 14, 2010   (JP) ................................. 2010-112667

(51) Int. Cl.
    *H01L 21/425*    (2006.01)
(52) U.S. Cl. .................. 438/527; 438/73; 257/E21.058
(58) Field of Classification Search .................. 438/527, 438/514, 73, 946
    See application file for complete search history.

(56) References Cited

U.S. PATENT DOCUMENTS

| | | | | |
|---|---|---|---|---|
| 5,458,755 A | 10/1995 | Fujiyama et al. | ......... | 204/224 R |
| 6,969,631 B2* | 11/2005 | Mouli et al. | ..................... | 438/57 |
| 7,323,731 B2 | 1/2008 | Yuzurihara et al. | ........... | 257/292 |
| 7,473,948 B2 | 1/2009 | Yuzurihara et al. | ........... | 257/292 |
| 7,846,758 B2* | 12/2010 | Ohkawa | ........................... | 438/48 |
| 7,928,486 B2 | 4/2011 | Yuzurihara et al. | ........... | 257/292 |
| 2007/0267666 A1 | 11/2007 | Park et al. | ....................... | 257/292 |
| 2010/0078633 A1 | 4/2010 | Watanabe | ......................... | 257/43 |
| 2010/0203667 A1 | 8/2010 | Hirota et al. | ..................... | 438/72 |
| 2010/0203670 A1 | 8/2010 | Ohtani et al. | ..................... | 438/98 |

FOREIGN PATENT DOCUMENTS

| | | |
|---|---|---|
| JP | 2000-156492 A | 6/2000 |
| JP | 2005-327835 A | 11/2005 |
| JP | 2007-311803 A | 11/2007 |

* cited by examiner

*Primary Examiner* — Alexander G. Ghyka
*Assistant Examiner* — Reema Patel
(74) *Attorney, Agent, or Firm* — Fitzpatrick, Cella, Harper & Scinto

(57) ABSTRACT

A method for manufacturing a sensor having pixels on a substrate, each pixel including a photoelectric converter, a charge-voltage converter, and a gate for forming a channel for transferring charges in the photoelectric converter to the charge-voltage converter, comprises a step of implanting ions into target regions of the substrate, where the photoelectric converters are to be formed, wherein the step is performed N times, and in each of the steps, the ions are implanted along a direction with an inclined angle with respect to a normal to the substrate surface, the target regions where the ions are implanted are different in each step, and for each step, a mask is formed on the substrate, having an opening for every N pixels, a plurality of the openings periodically arranged in a direction along an intersection line between the surface and a plane determined by the normal and the direction.

8 Claims, 12 Drawing Sheets

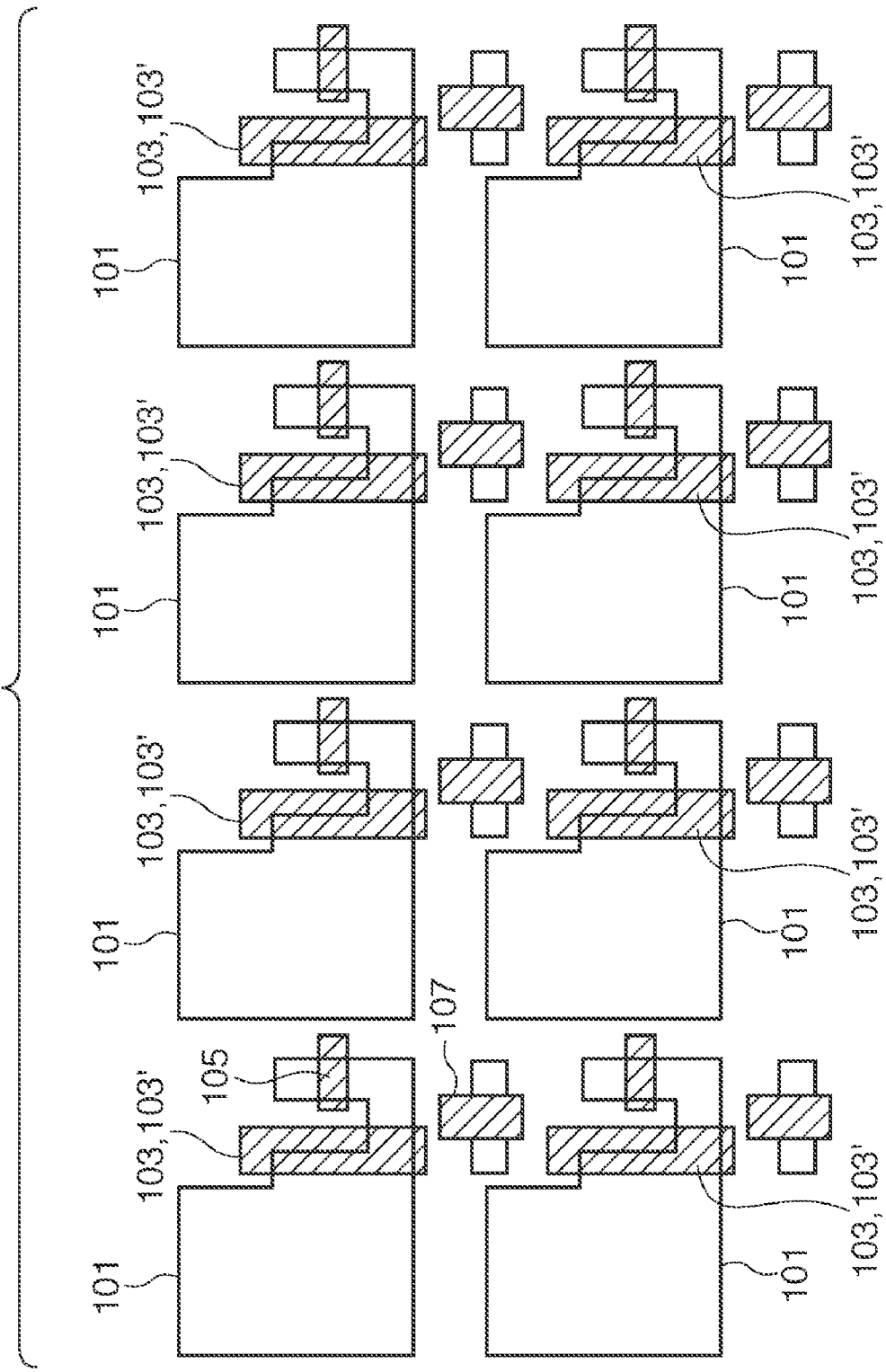

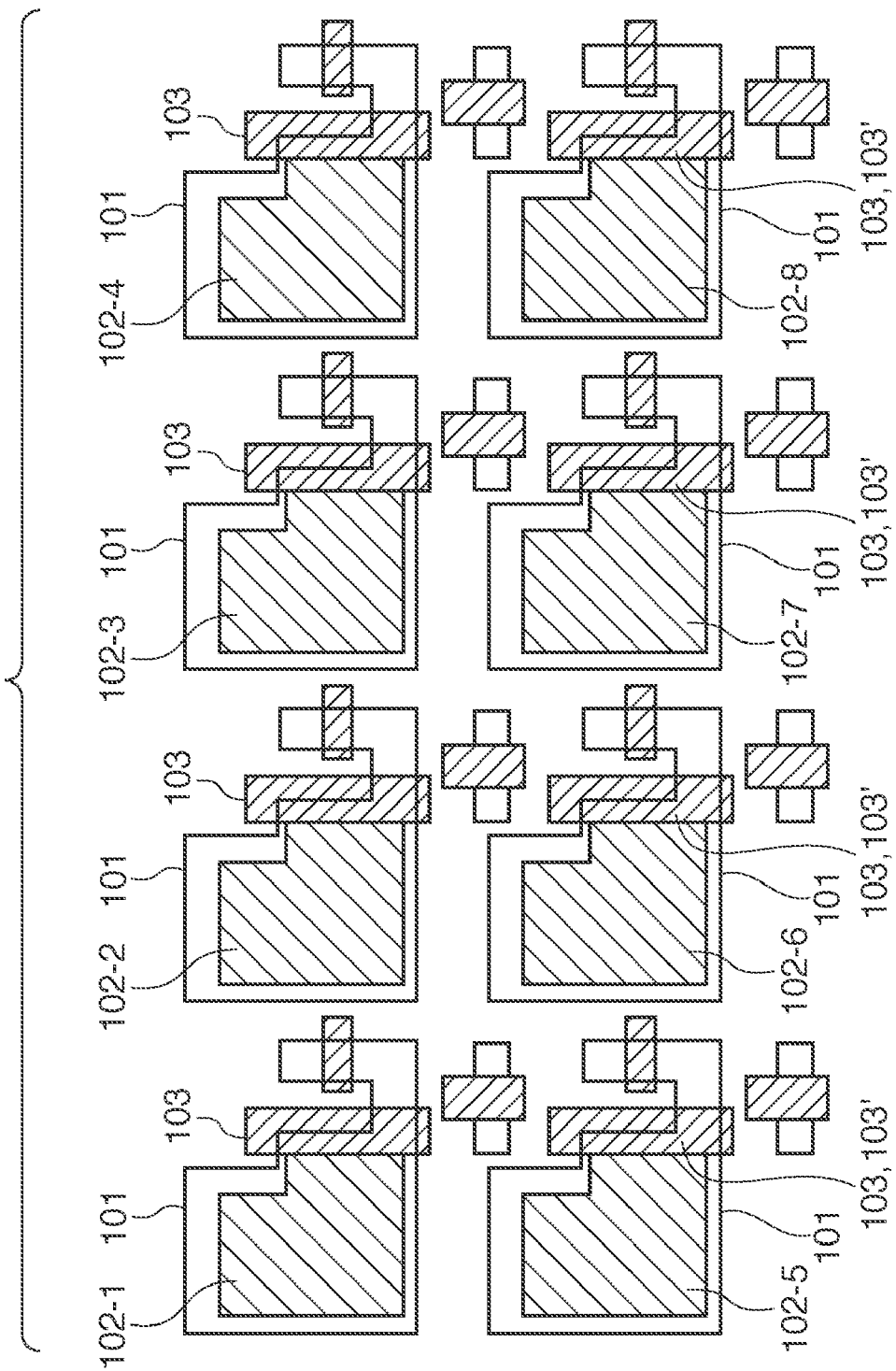

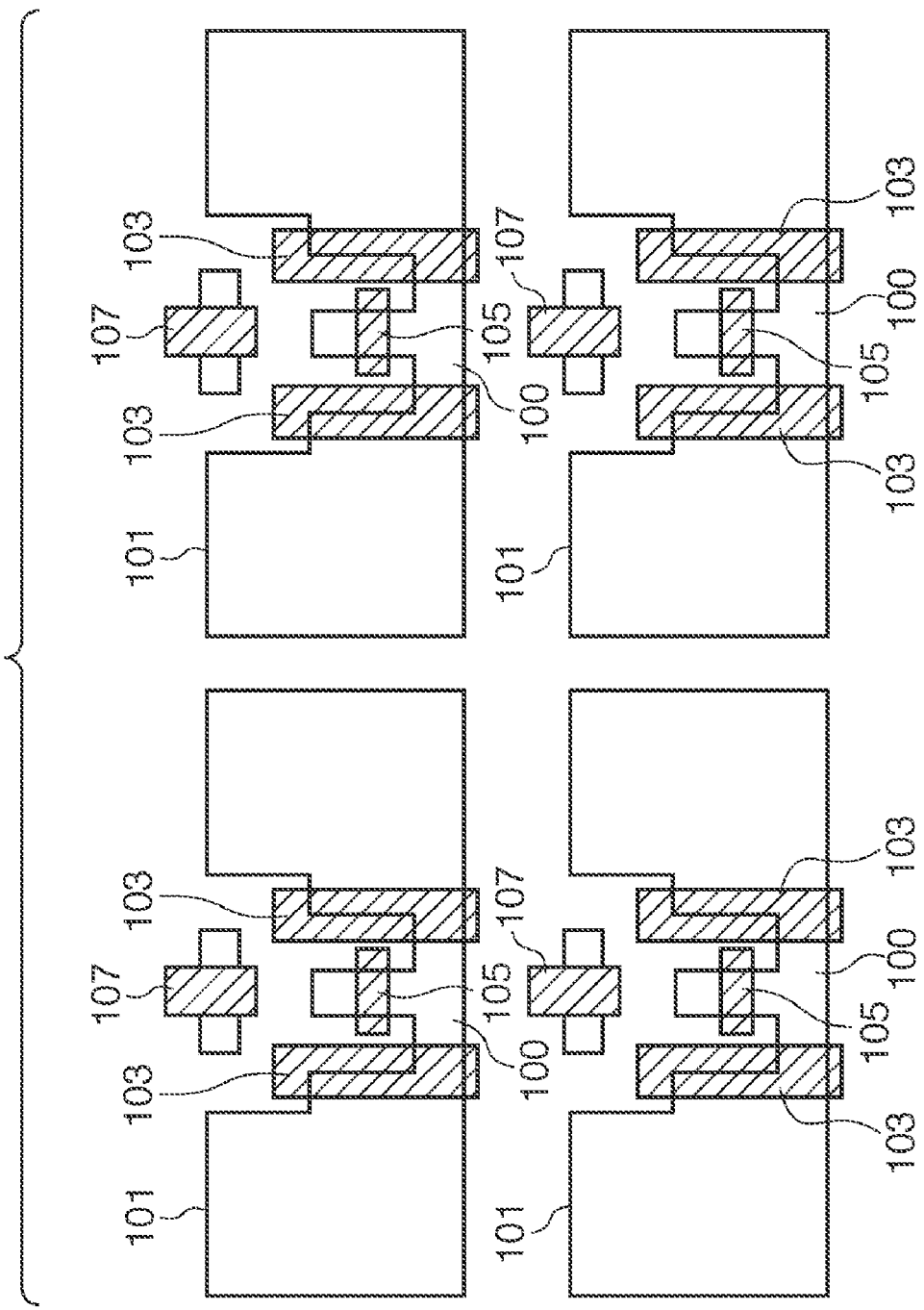

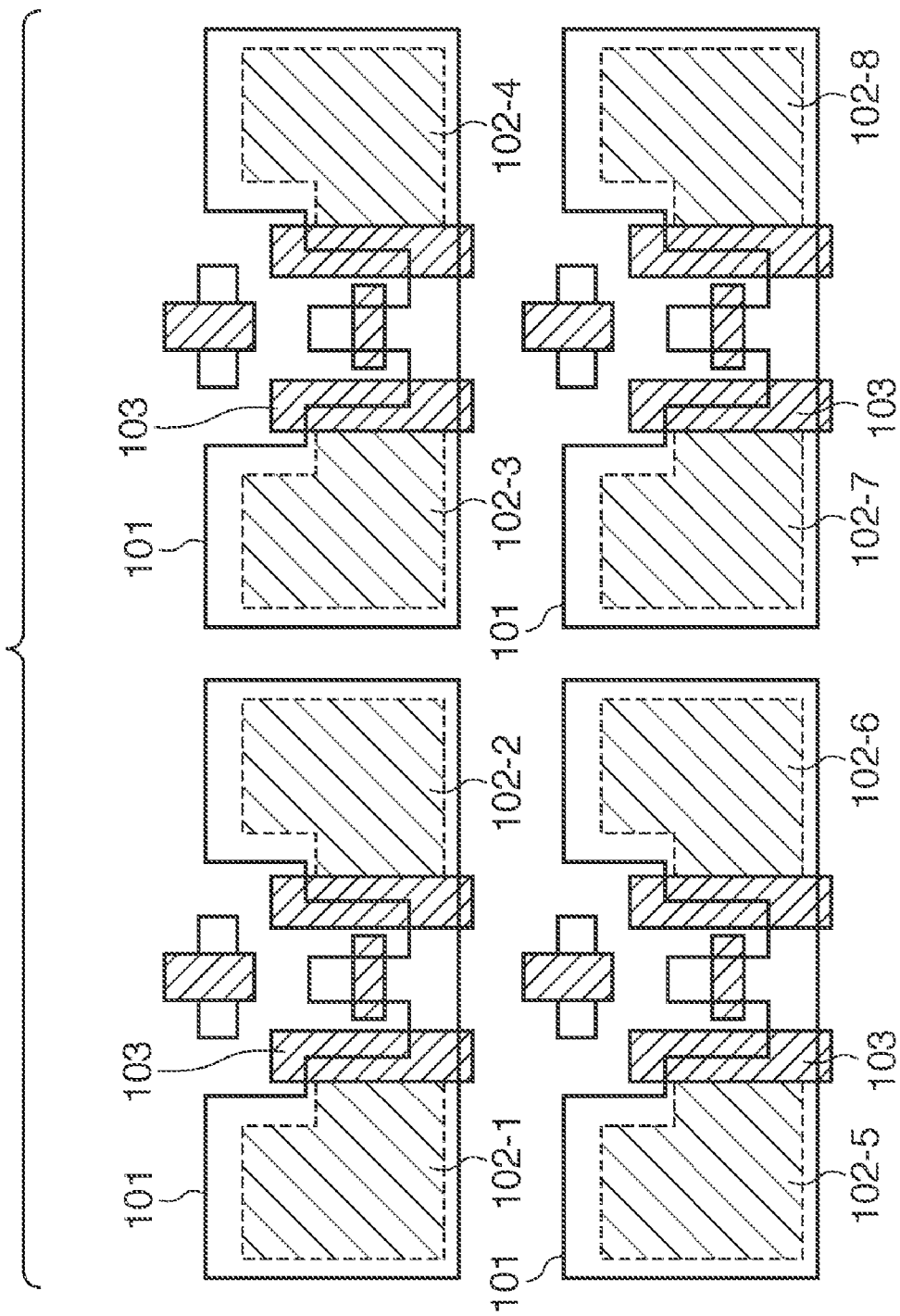

METHOD FOR MANUFACTURING SOLID-STATE IMAGE SENSOR

BACKGROUND OF THE INVENTION

1. Field of the Invention

The present invention relates to a method for manufacturing a solid-state image sensor.

2. Description of the Related Art

There is known a solid-state image sensor having an arrangement which transfers, by a transfer switch, charges generated by photoelectric conversion in a photoelectric converter to a charge-voltage converter such as a floating diffusion region. Japanese Patent Laid-Open No. 2007-311803 discloses a method for implanting ions into a substrate at an inclined angle with respect to the normal to the surface of the substrate in order to form an impurity region constituting a photodiode. According to this method, ions are also implanted under the gate (transmission gate) of a transfer switch.

If ions are implanted into a substrate at an inclined angle with respect to the normal to the surface of the substrate, a region which is shaded by a mask defining an ion implantation region is produced. If ion implantation into part of a region where the charge accumulation region of a photodiode is to be formed, that is, a region where ions are to be implanted is interfered with, the quantity of charges to be accumulated, that is, the saturated charge quantity, becomes small, thereby narrowing the dynamic range of the solid-state image sensor.

SUMMARY OF THE INVENTION

The present invention provides a method for manufacturing a solid-state image sensor advantageous to improvement of the saturated charge quantity.

One of the aspects of the present invention provides a method for manufacturing a solid-state image sensor having a plurality of pixels formed on a semiconductor substrate, each pixel including a photoelectric converter, a charge-voltage converter, and a gate for forming a channel for transferring charges generated in the photoelectric converter to the charge-voltage converter, the method comprising implanting ions into target regions, of the semiconductor substrate, where the photoelectric converters are to be formed, where the ion implantation step is performed N times (N being a natural number equal to 2 or more), and in each of the ion implantation steps, the ions are implanted along a direction with an inclined angle with respect to a normal to a surface of the semiconductor substrate, the target regions where the ions are implanted are different in each of the ion implantation steps, and for each ion implantation step performed N times, a mask is formed on the semiconductor substrate, having an opening for every N pixels, a plurality of the openings periodically arranged in a direction along an intersection line between the surface of the semiconductor substrate and a plane determined by the normal and the direction with the inclined angle.

Further features of the present invention will become apparent from the following description of exemplary embodiments with reference to the attached drawings.

BRIEF DESCRIPTION OF THE DRAWINGS

FIGS. 2A to 2E are views for explaining a method for manufacturing a solid-state image sensor according to the first embodiment;

FIGS. 5A to 5D and 6 are views for explaining a method for manufacturing a solid-state image sensor according to the third embodiment.

DESCRIPTION OF THE EMBODIMENTS

A solid-state image sensor according to embodiments of the present invention can include a pixel array in which a plurality of pixels are two-dimensionally arranged, a row selecting circuit configured to select a row in the pixel array, a column selecting circuit configured to select a column in the pixel array, and a read out circuit configured to read out a signal from the pixel array via a column signal line. The pixel array, row selecting circuit, column selecting circuit, and read out circuit are formed on a semiconductor substrate. Typically, the read out circuit reads out the signals of the pixels of a row which has been selected by the row selecting circuit in the pixel array. The column selecting circuit selects a signal to be output outside among the signals of the pixels of the row read by the read out circuit.

Figure 1:
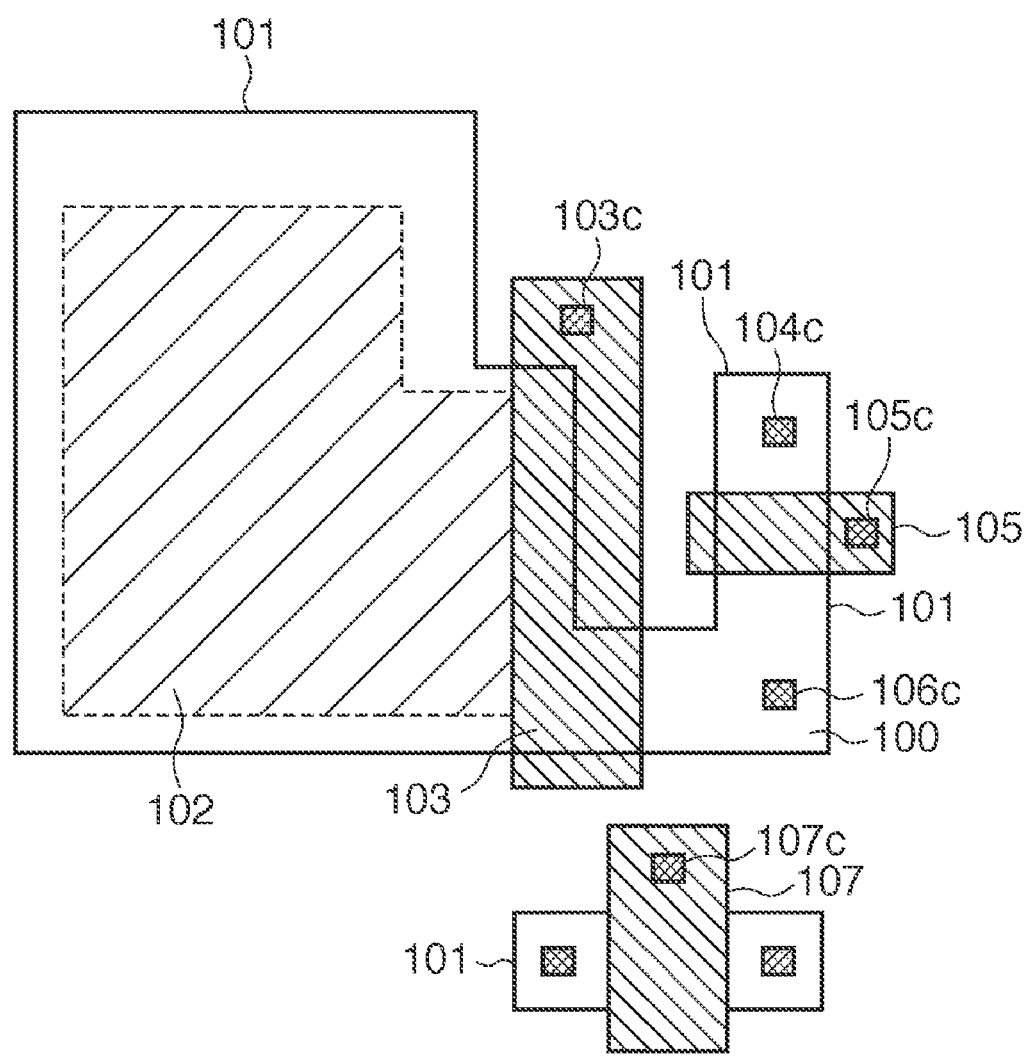
FIG. 1 is a layout view for illustratively explaining the arrangement of one pixel according to the first and second embodiments of the present invention.

FIG. 1 is a layout view for illustratively explaining the arrangement of one pixel according to the first and second embodiments of the present invention. Each pixel can include a photoelectric converter, a charge-voltage converter, a transfer switch, an amplifier, and a reset switch. The photoelectric converter has a photodiode 102. The charge-voltage converter includes a floating diffusion (to be referred to as an FD hereinafter) 100. The transfer switch serves as a MOS transistor which transfers charges accumulated in the photodiode 102 to the FD 100, and includes a gate 103. The gate 103 is connected to the row selecting circuit via a transfer control line having a contact plug 103c. When the row selecting circuit drives the transfer control line to an active level, the gate 103 forms a channel for transferring charges accumulated in the photodiode 102 to the FD 100 under itself. The reset switch serves as a MOS transistor for resetting the FD 100, and includes a gate 105. The gate 105 is connected to the row selecting circuit via a reset control line having a contact plug 105c. One diffusion region of the MOS transistor constituting the reset switch is connected with a reset line having a contact plug 104c. The amplifier serves as a MOS transistor for outputting a signal corresponding to the electric potential of the FD 100 to a column signal line, and includes a gate 107. The gate 107 is connected with the FD 100 via a signal line having a contact plug 107c connected to the gate 107 and a contact plug 106c connected to the FD 100. The photodiode 102, the FD 100, the diffusion regions of the reset switch, and the diffusion regions of the amplifier are arranged on an active region 101. A region excluding the active region 101 is an isolation region.

Figure 2B:
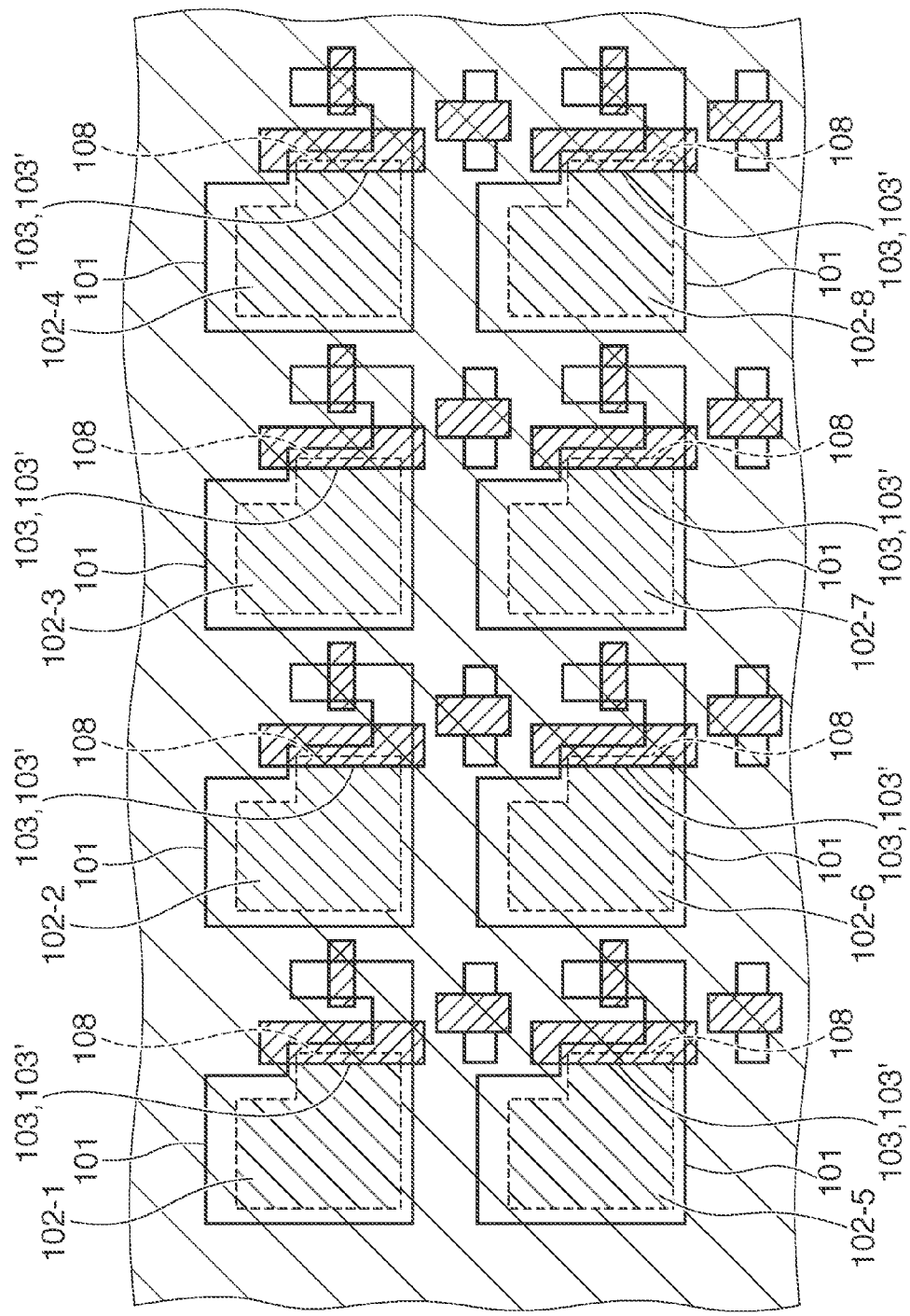
Figure 2C:
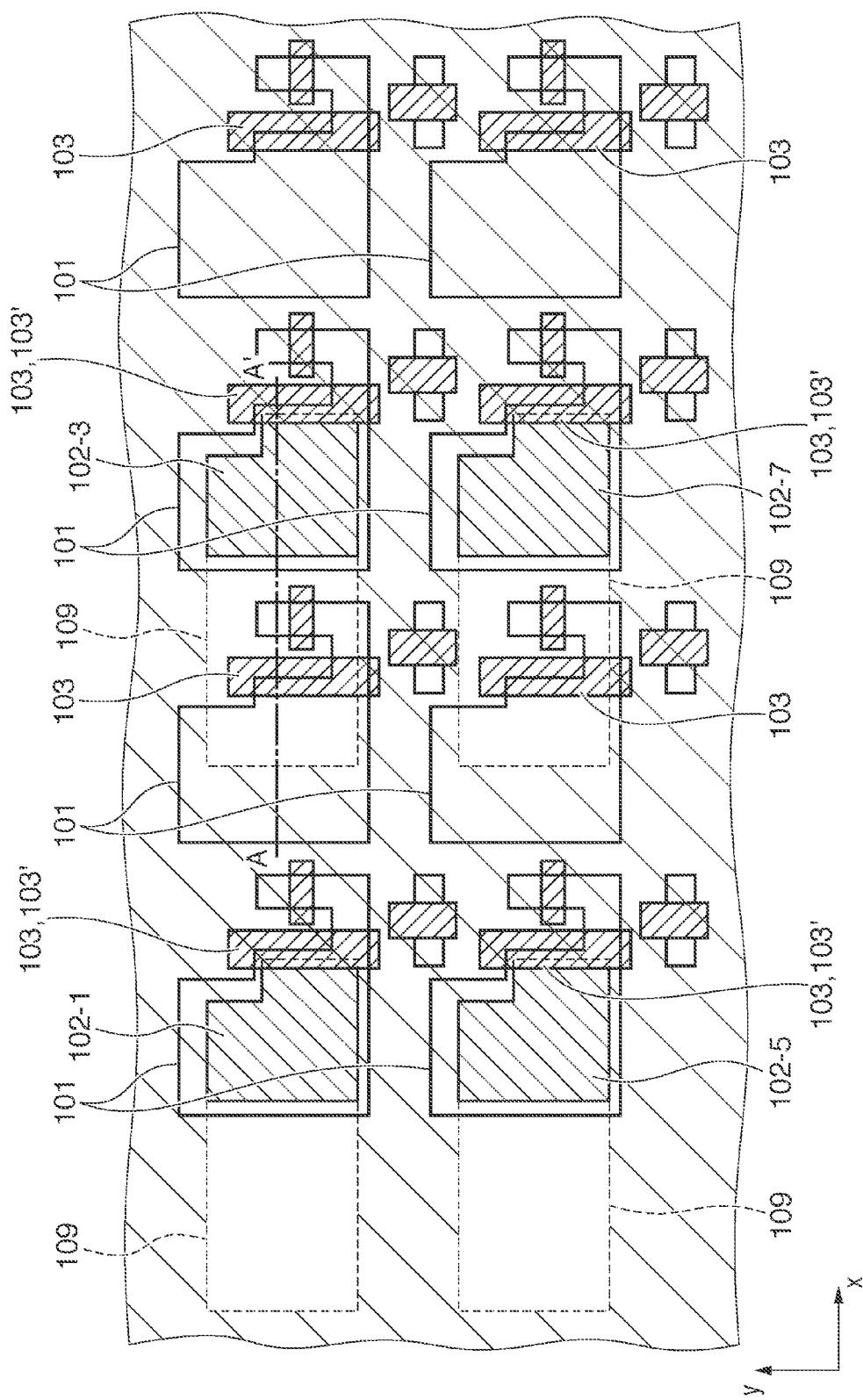
Figure 2D:
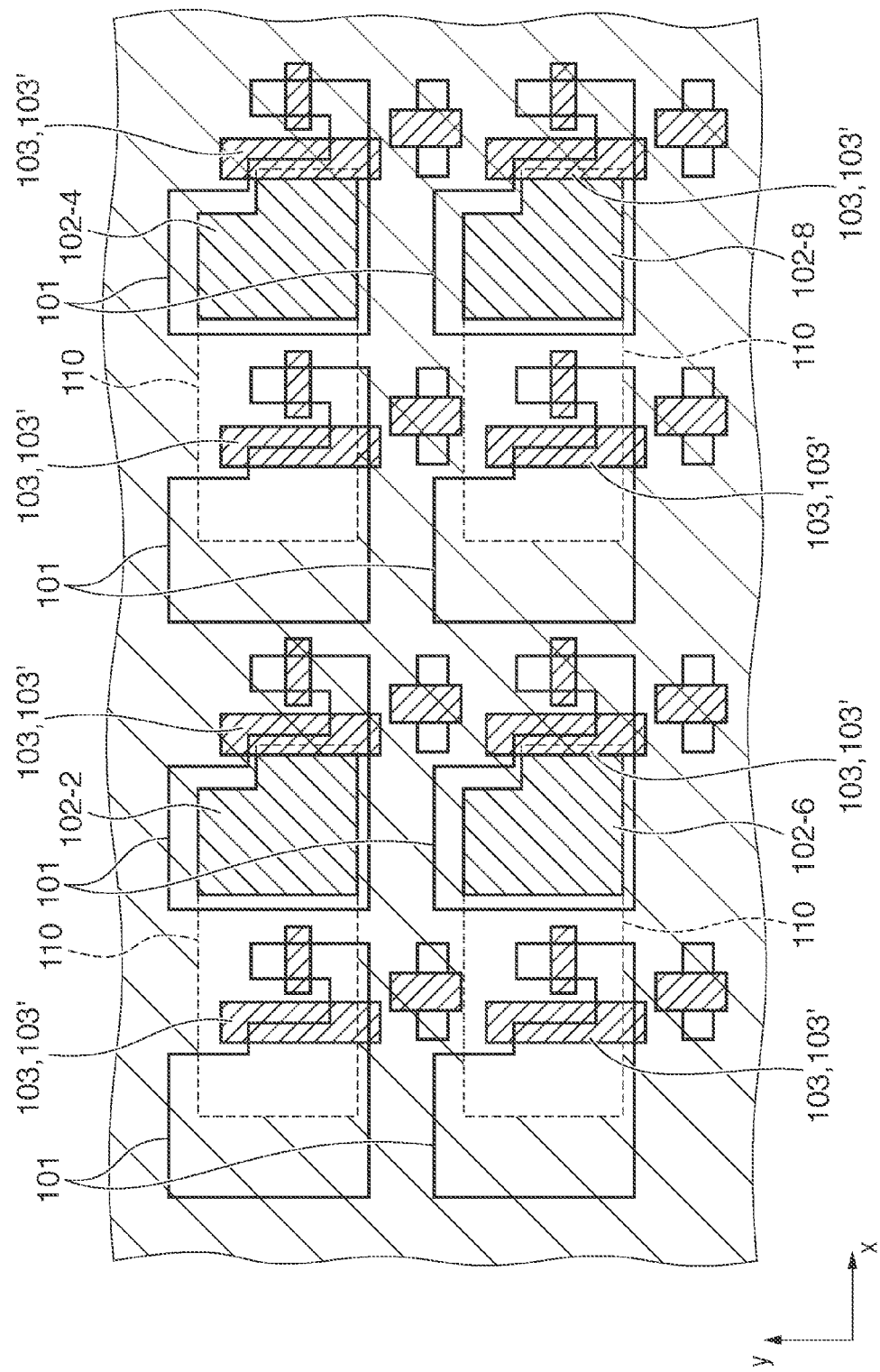
Figure 3:
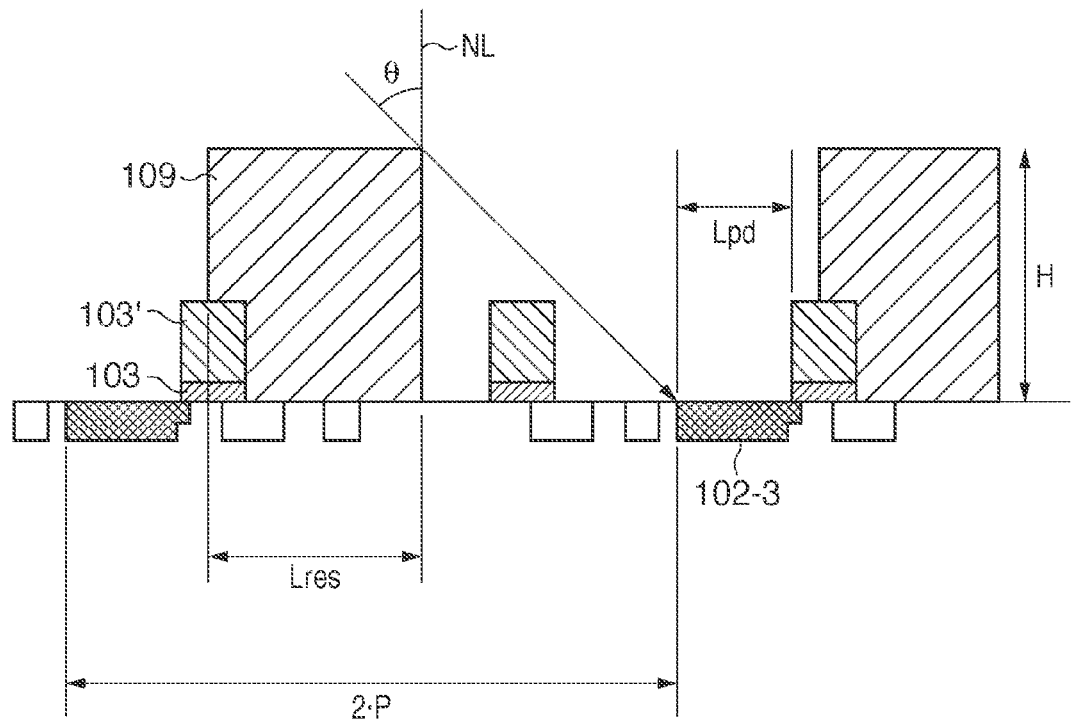
FIG. 3 is a sectional view taken along a line A-A' in FIG. 2C.

With reference to FIGS. 2A to 2E and 3, a method for manufacturing a solid-state image sensor according to the first embodiment of the present invention will be described. For simplicity, FIGS. 2A to 2E show only eight pixel regions in a pixel array. FIG. 3 is a sectional view taken along a line A-A' in FIG. 2C. In a step shown in FIG. 2A, an isolation region is formed on the semiconductor substrate and a portion except for the isolation region serves as the active region 101. Subsequently, the gate 103 of the transfer switch, the gate 105 of the reset switch, and the gate 107 of the amplifier are formed. In the example shown in FIGS. 2A to 2E, the active region 101 and the gates 103, 105, and 107 are translational-symmetrically arranged. It is possible to form the gates 103, 105, and 107 by forming a gate material layer (for example, a polysilicon layer) on the semiconductor substrate, forming a first resist pattern 103' thereon, and etching the gate material layer using the first resist pattern 103' as a mask.

In a step (simultaneous ion implantation step) shown in FIG. 2B, the photodiode 102 is formed by forming a second resist pattern 108, and implanting ions into the semiconductor substrate using the second resist pattern 108 as a mask. In the step shown in FIG. 2B, ions are simultaneously implanted into target regions where all the photodiodes of the plurality of pixels of the pixel array are to be formed. Note that FIGS. 2B to 2E show photodiodes 102-1 to 102-8 instead of photodiodes 102 for the purpose of discriminating them for a plurality of pixels. In the step shown in FIG. 2B, an ion approach direction to the semiconductor substrate in ion implantation can be parallel to the normal to the surface of the semiconductor substrate. In other words, ions are implanted into the semiconductor substrate along a direction parallel to the normal to the surface of the semiconductor substrate. Alternatively, in the step shown in FIG. 2B, the ion approach direction to the semiconductor substrate may be an inclined direction (for example, an inclined angle is typically set to 7° in the case of a <100> substrate) with respect to the normal so as to suppress the influence of channeling. By performing the ion implantation step shown in FIG. 2B in addition to two ion implantation steps shown in FIGS. 2C and 2D (to be described later), it is possible to individually adjust impurity profiles in a region under the gate 103 and the remaining region. In the step shown in FIG. 2B, an average ion doping depth can fall within, for example, the range from 0.15 μm (inclusive) to 3.00 μm (inclusive). The doping depth is a depth with respect to an interface between the semiconductor region of the semiconductor substrate and an insulating film stacked on the surface side of the semiconductor region. Note that the step shown in FIG. 2B may be omitted.

The second resist pattern 108 may be formed after removing the first resist pattern 103', or may be formed without removing the first resist pattern 103'. In the latter case, the thickness (depth) of a portion, which is formed under the gate 103, of the photodiode 102 is determined based on the thickness of the gate 103 and that of the first resist pattern 103'.

In the step shown in FIGS. 2C and 3, a third resist pattern 109 is formed after removing the second resist pattern 108. Then, ions are implanted into the semiconductor substrate by using the first resist pattern 103' and the third resist pattern 109 as a mask, and setting the ion approach direction to the semiconductor substrate to a direction with an inclined angle θ with respect to a normal NL to the surface of the semiconductor substrate. In other words, ions are implanted into the semiconductor substrate along a direction with the inclined angle θ with respect to the normal NL to the surface of the semiconductor substrate. The inclined angle θ can fall within, for example, the range from 5° (inclusive) to 60° (inclusive), preferably the range from 15° (inclusive) to 60° (inclusive). The inclined angle θ may be determined so that ions are implanted under the gate 103. When implanting ions at an inclined angle with respect to the normal NL, the shadow of the third resist pattern 109, that is, a region where ions are not implanted is generated. In the example shown in FIG. 2C, ions are implanted into target regions where the photodiodes 102-1, 102-3, 102-5, and 102-7 of the photodiodes 102-1 to 102-8 are to be formed. On the other hand, no ions are implanted into target regions where the photodiodes 102-2, 102-4, 102-6, and 102-8 are to be formed. Inclining the ion approach direction forms an arrangement in which the photodiode partially extends underneath the gate 103, that is, an overlap arrangement in which the gate 103 and the photodiode overlap each other. This arrangement is advantageous to improvement of the efficiency of transferring charges from the photodiode 102 to the FD 100. In the step shown in FIGS. 2C and 3, an average ion doping depth can fall within the range from 0 μm (inclusive) to 0.15 μm (inclusive). The doping depth is a depth with respect to an interface between the semiconductor region of the semiconductor substrate and the insulating film stacked on the surface side of the semiconductor region. Before forming the third resist pattern 109, all or part of the first resist pattern 103' may be left as described above, or both the second resist pattern 108 and the first resist pattern 103' may be removed.

In a step shown in FIG. 2D, a fourth resist pattern 110 is formed after removing the third resist pattern 109. Then, ions are implanted into the semiconductor substrate by using the first resist pattern 103' and the fourth resist pattern 110 as a mask, and setting the ion approach direction to the semiconductor substrate to a direction with the inclined angle θ with respect to the normal NL to the surface of the semiconductor substrate. The inclined angle θ is typically set to the same angle as in the step shown in FIG. 2C. In the example shown in FIG. 2D, ions are implanted into target regions where the photodiodes 102-2, 102-4, 102-6, and 102-8 of the photodiodes 102-1 to 102-8 are to be formed. On the contrary, no ions are implanted into target regions where the photodiodes 102-1, 102-3, 102-5, and 102-7 are to be formed. Before forming the fourth resist pattern 110, all or part of the first resist pattern 103' may be left as described above, or both the third resist pattern 109 and the first resist pattern 103' may be removed.

Figure 6:
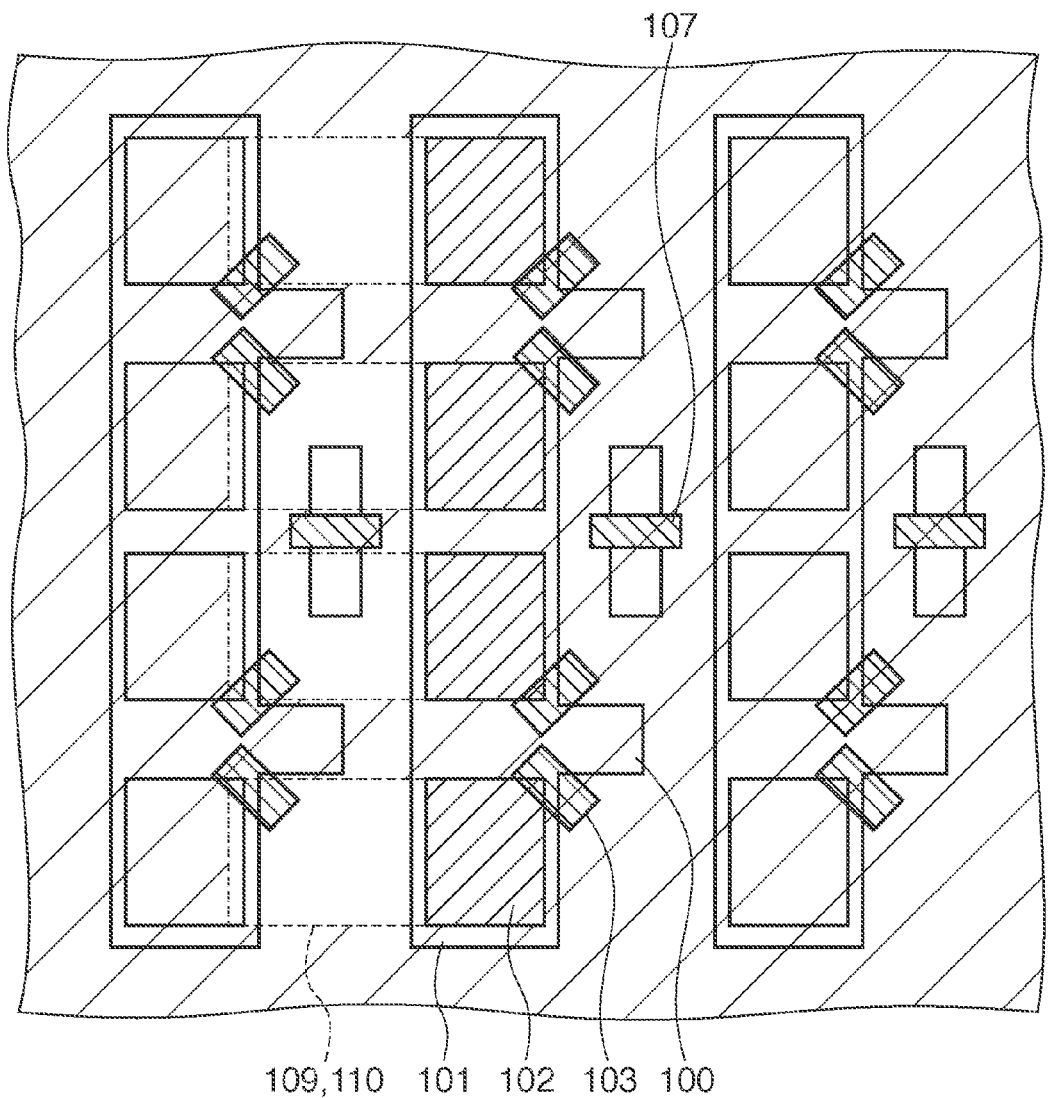

Implanting ions at the inclined angle θ in the steps shown in FIGS. 2C and 2D makes part of the photodiode 102 extend underneath the gate 103 of the transfer switch, and contributes to controlling the accumulated charge quantity of the photodiode 102. The third resist pattern 109 periodically has openings, which are used for implanting ions into target regions, for every two pixels in the channel length direction (x direction in FIG. 2C) of a channel formed under the gate 103 of the transfer switch with a MOS transistor arrangement. The target region represents a region where a photodiode is to be formed, that is, a region where ions are to be implanted. Similarly, as is apparent from FIG. 2D, the fourth resist pattern 110 periodically has openings, which are used for implanting ions into target regions, for every two pixels in the channel length direction (x direction in FIG. 2D) of a channel for transferring charges, which is formed under the gate 103 of the transfer switch. The area of the opening of the third resist pattern 109 or fourth resist pattern 110 is larger than that of the individual photodiode 102 (that is, a target region) in order to enable ion implantation at the inclined angle θ. In this example, the channel length direction is parallel to a direction along an intersection line between the surface of the semiconductor substrate and a plane determined by an ion approach direction to the semiconductor substrate and the normal NL to the semiconductor substrate. The plane determined by the approach direction and the normal NL includes, for example, the normal NL and the approach direction. As shown in FIG. 6, however, the channel length direction need not be parallel to the direction along the intersection line.

A design method for the third resist pattern 109 will be explained with reference to FIG. 3. It is also possible to design the fourth resist pattern 110 by the same design method as that for the third resist pattern 109. Let Lpd be the width of the photodiode 102-3 (the same goes for other photodiodes), and θ be the inclined angle with respect to the normal NL to the ion approach direction to the semiconductor substrate. Assume also that H represents the thickness of the resist pattern 109; P, the pixel array pitch; and Lres, the width of the resist pattern 109. Then, we have:

$$H \cdot \tan \theta + Lpd + Lres = 2 \cdot P$$

Note that each of Lpd, P, and Lres represents a width in the channel length direction.

The width Lres of the resist pattern 109 cannot have a negative value. Assume that Lmin represents a minimum processing size in the channel length direction of the resist pattern in a photolithography process. In this case, Lmin<Lres must be satisfied. The inclined angle θ is thus determined so as to satisfy Lmin<Lres. The area of a portion of the photodiode which is present under the gate 103 depends on the inclined angle θ.

Figure 4:
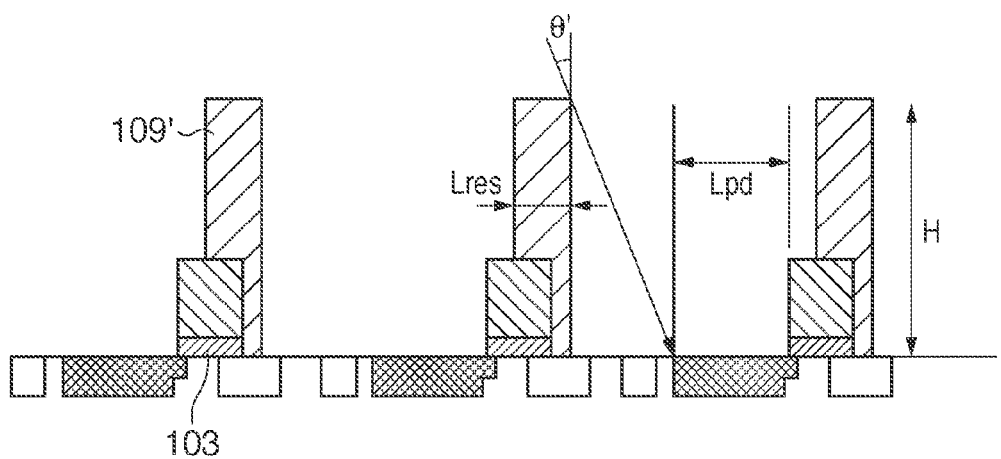
FIG. 4 is a sectional view for explaining a comparative example.

Consider, for the purpose of comparison, a case in which ions are implanted into the semiconductor substrate at an inclined angle θ' using, as a mask, a resist pattern 109' provided with openings corresponding to target regions where the photodiodes of all pixels are to be formed, with reference to FIG. 4. In this case, the degree of freedom of selection of the inclined angle θ' is more limited than that in the first embodiment since it is necessary to determine the inclined angle θ' so as to satisfy:

$$H \cdot \tan \theta' + Lpd + Lmin < P$$

In the first embodiment, on a resist pattern used for ion implantation (to be referred to as overlap ion implantation hereinafter) for forming an overlap arrangement, an opening for ion implantation is provided for every two pixels in the channel length direction (or the direction along the intersection line) of the channel formed by the gate. It is, therefore, necessary to form a resist pattern twice for overlap ion implantation, and thus two reticles are used. Overlap ion implantation can also be referred to as divisional ion implantation, because ions are implanted into target regions where the photodiodes of some of the plurality of pixels are to be formed, every time overlap ion implantation is performed.

In the second embodiment, an opening for ion implantation is provided for the resist pattern for every three pixels in the channel length direction (or the direction along the intersection line). In this case, it is necessary to form a resist pattern three times for overlap ion implantation, and thus three reticles are used. By periodically providing openings for ion implantation for every three pixels, however, it is possible to widen the inclined angle θ, and/or enable to deal with reduction of the pixel pitch P.

It is possible to extend the first and second embodiments to a case in which overlap ion implantation is performed N times, by providing an opening for ion implantation for a resist pattern for every N pixels in the channel length direction (or the direction along the intersection line). A design requirement is given by:

$$H \cdot \tan \theta + Lpd + Lmin < N \cdot P$$

where N is a natural number equal to 2 or more.

If N is larger, the number of times of execution of overlap ion implantation increases while it is possible to widen the inclined angle θ and/or enable to deal with reduction of the pixel pitch P.

A method for manufacturing a solid-state image sensor according to the third embodiment of the present invention will be described with reference to FIGS. 5A to 5D. Overlap ion implantation may be performed N times at the same inclined angle θ as described above. Overlap ion implantation may also be performed at different inclined angles at least twice of N times. Alternatively, overlap ion implantation may be performed at different inclined angles N times. Note that details of this embodiment not specifically mentioned below conform to the first embodiment.

In an example shown in FIGS. 5A to 5D, one FD 100, one reset switch (gate 105), and one amplifier (gate 107) are common to two pixels. This contributes to reduction of the area of one pixel, and to a higher density of a pixel array. In a step shown in FIG. 5A, an active region 101, a gate 103 of a transfer switch, the gate 105 of the reset switch, and the gate 107 of the amplifier are formed. It is possible to form the gates 103, 105, and 107 by forming a gate material layer (for example, a polysilicon layer) on a semiconductor substrate, forming the first resist pattern (not shown) thereon, and etching the gate material layer using the first resist pattern as a mask. In the example shown in FIGS. 5A to 5D, a unit pixel group formed by two pixels which share the FD 100, reset switch, and amplifier has a mirror-symmetrical arrangement. A plurality of unit pixel groups is translational-symmetrically arranged.

In a step shown in FIG. 5B, as in the step shown in FIG. 2B, photodiodes 102-1 to 102-8 are formed by forming the second resist pattern (not shown), and implanting ions into the semiconductor substrate using the second resist pattern as a mask. At this time, an ion implantation direction may be a direction parallel to the normal to the surface of the semiconductor substrate, or an inclined direction with respect to the normal so as to suppress the influence of channeling.

Figure 5C:
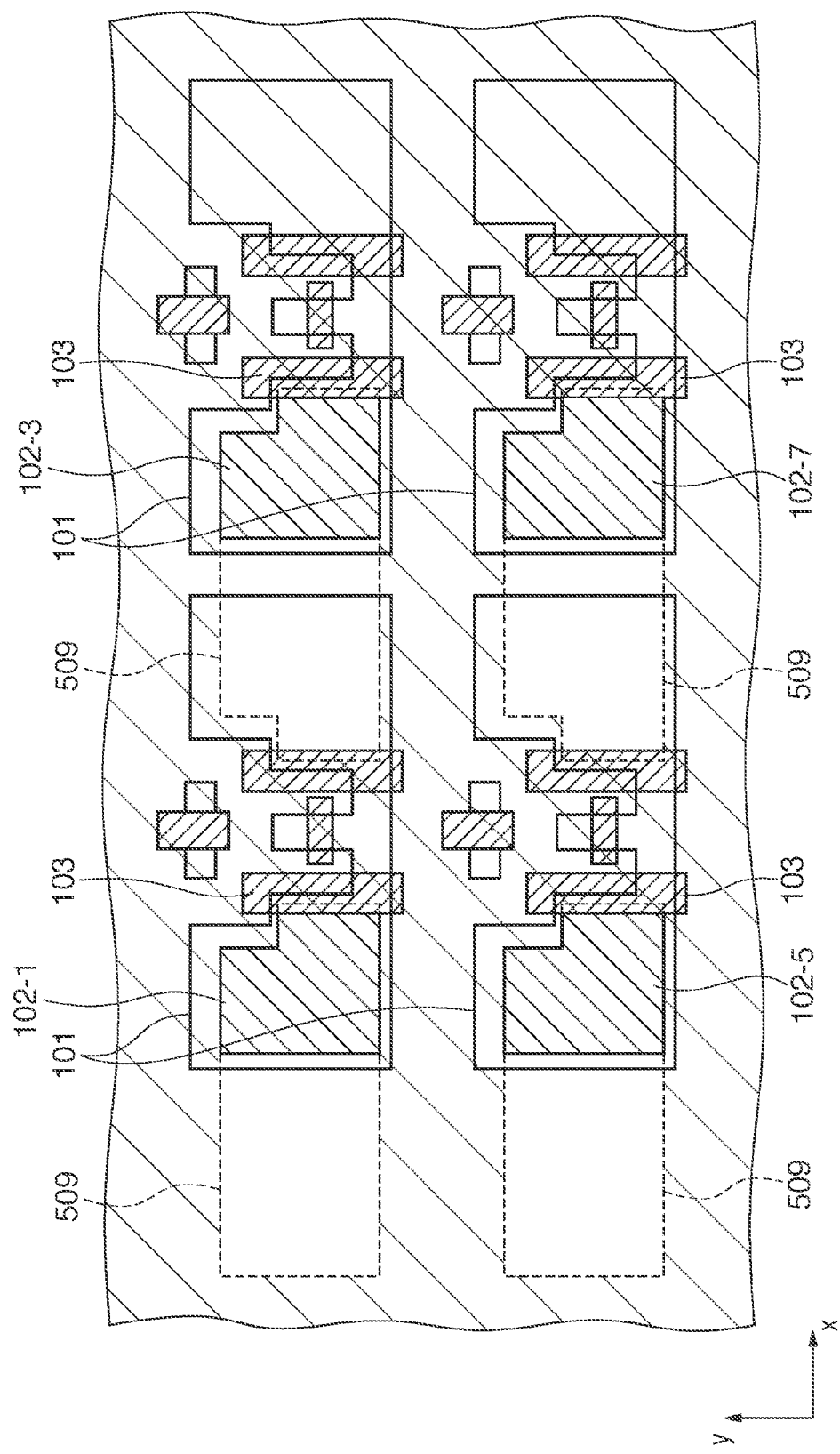

In a step shown in FIG. 5C, a third resist pattern 509 is formed after removing the second resist pattern. Then, ions are implanted into the semiconductor substrate, using the third resist pattern 509 as a mask, at the inclined angle θ with respect to the normal to the surface of the semiconductor substrate so that ions are implanted under the gate 103. The inclined angle θ falls within, for example, the range from 5° to 60°, preferably the range from 15° to 60°. In the example shown in FIG. 5C, ions are implanted into regions where the photodiodes 102-1, 102-3, 102-5, and 102-7 of the photodiodes 102-1 to 102-8 are to be formed. On the other hand, no ions are implanted into regions where the photodiodes 102-2, 102-4, 102-6, and 102-8 are to be formed.

Figure 5D:
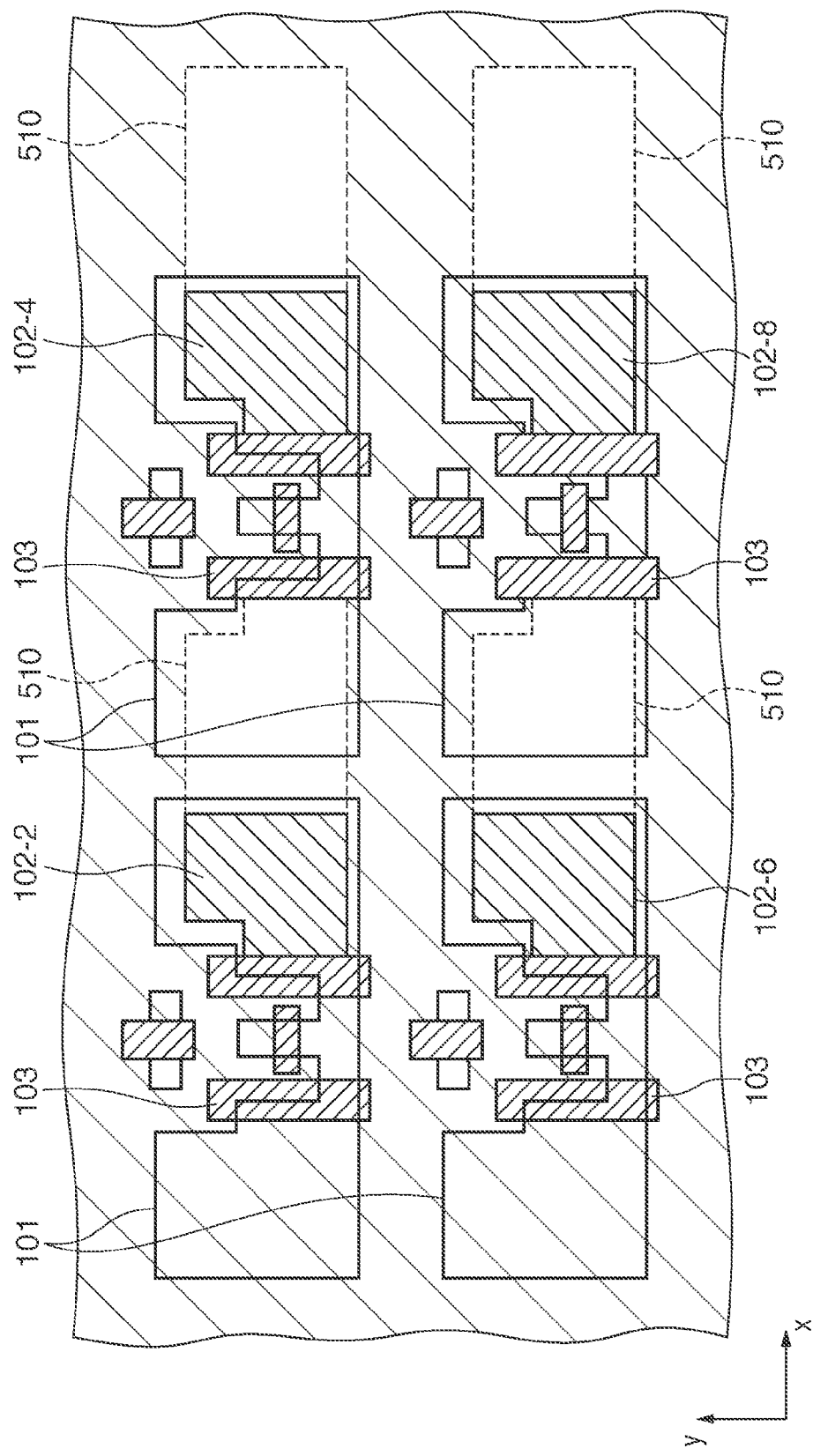

In a step shown in FIG. 5D, a fourth resist pattern 510 is formed after removing the third resist pattern 509. Then, ions are implanted into the semiconductor substrate, using the fourth resist pattern 510 as a mask, at an inclined angle −θ with respect to a normal NL to the surface of the semiconductor substrate so that ions are implanted under the gate 103. The sign of the inclined angle −θ is different from that of the inclined angle θ in the step shown in FIG. 5C. Consider an xyz coordinate system with the xy plane parallel to the surface of the semiconductor substrate and the x-direction as the channel length direction. In this case, the inclined angle −θ corresponds to a direction with +x-direction components, and the inclined angle θ corresponds to a direction with −x-direction components. That is, the inclined angle (ion implantation direction) in the overlap ion implantation step shown in FIG. 5C is different from that in the overlap ion implantation step shown in FIG. 5D. Typically, θ in the overlap ion implantation step shown in FIG. 5C is the same as that in the overlap ion implantation step shown in FIG. 5D but they may be different from each other. In the example shown in FIG. 5D, ions are implanted into regions where the photodiodes 102-2, 102-4, 102-6, 102-8 of the photodiodes 102-1 to 102-8 are to be formed. On the contrary, no ions are implanted into regions where the photodiodes 102-1, 102-3, 102-5, and 102-7 are to be formed.

The present invention is applicable to various symmetrical arrangements such as an arrangement with a plurality of pixels or pixel groups translational-symmetrically arranged, that with a plurality of pixels or pixel groups mirror-symmetrically arranged, and that with a plurality of pixels or pixel groups rotational-symmetrically arranged.

FIG. 6 is a layout view for explaining a method for manufacturing a solid-state image sensor according to the fourth embodiment of the present invention. Parts with the same functions as those in the first and second embodiments have the same reference numerals, and a detailed description thereof will be omitted. In the first embodiment, as shown in FIG. 2C, the channel length direction (or the direction of the intersection line) is parallel to the row direction of the pixels arranged in a matrix topology. The fourth embodiment is different from the first embodiment in that a channel length direction is not parallel to either the pixel row or column direction. Furthermore, the fourth embodiment is different from the first embodiment in that a plurality of photodiodes share one FD.

In the manufacturing method of the first embodiment, an inclined angle is set in the step shown in FIG. 2C so that the inclined angle becomes θ at a cross section taken along the channel length direction (A-A'). In the manufacturing method of the fourth embodiment, an inclined angle is set so that the inclined angle becomes θ at a cross section taking along the pixel row or column direction. In the manufacturing method of the fourth embodiment, the third or fourth resist pattern is provided with an opening for every two pixels in the row direction in FIG. 6. Except for the above points, the same manufacturing method as in the first embodiment can be used.

In the manufacturing method according to each of the first to third embodiments, ions are implanted to form an overlap arrangement in the step shown in FIG. 2C. Even if an overlap arrangement is not formed, ions may be implanted in an inclined direction (an inclined angle is typically set to 7° in the case of a <100> substrate) with respect to the normal to the surface of the semiconductor substrate for the purpose of preventing channeling. If the number of pixels is increased, a portion shaded by a resist presents a problem in implanting ions in an inclined direction for preventing channeling. The present invention is also applicable to such case.

As described above, in each embodiment of the present invention, overlap ion implantation is performed N (which is a natural number of 2 or more) times using a mask (resist pattern) with an opening for ion implantation for every N pixels in order to form photodiodes. This enables one to implant ions for forming a photodiode on a wide region within each pixel region. With this processing, the quantity of signal charges to be accumulated in a photodiode, that is, a saturated charge quantity increases while the efficiency of transferring charges to the FD improves.

Although a resist pattern is used as a mask for ion implantation in the above embodiments, another mask like a so-called hard mask may be used. It is possible to form a hard mask by forming, by a photolithography process, a resist pattern on a material layer constituting the hard mask, and patterning the material layer by etching using the resist pattern as a mask.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-112667, filed May 14, 2010, which is hereby incorporated by reference herein in its entirety.

What is claimed is:

1. A method for manufacturing a solid-state image sensor having a plurality of pixels formed on a semiconductor substrate, each pixel including a photoelectric converter, a charge-voltage converter, and a gate for forming a channel for transferring charges generated in the photoelectric converter to the charge-voltage converter, the method comprising:
    an ion implantation step of implanting ions into target regions of the semiconductor substrate, where the photoelectric converters are to be formed,
    wherein said ion implantation step is performed N times (N being a natural number equal to 2 or more),
    in each of said ion implantation steps, the ions are implanted along a direction with an inclined angle with respect to a normal to a surface of the semiconductor substrate,
    the target regions where the ions are implanted are different in each of said ion implantation steps, and
    for each of said ion implantation steps, a mask is formed on the semiconductor substrate, having an opening for every N pixels, a plurality of the openings periodically arranged in a direction along an intersection line between the surface of the semiconductor substrate and a plane determined by the normal and the direction with the inclined angle.

2. The method according to claim 1, wherein the target region includes a region under the gate.

3. The method according to claim 1, further comprising:
    a simultaneous ion implantation step of simultaneously implanting ions into all the target regions of the plurality of pixels.

4. The method according to claim 1, wherein an area of the opening is larger than that of the target region.

5. The method according to claim 1, wherein the inclined angles of at least two of said ion implantation steps are different from each other.

6. The method according to claim 1, wherein the directions with the inclined angle, of at least two of said ion implantation steps, are different from each other.

7. The method according to claim 1, wherein $$H \cdot \tan\theta + Lpd + Lmin < N \cdot P$$

where P represents an array pitch of the plurality of pixels in a direction along the intersection line, θ represents the inclined angle, H represents a thickness of the mask, Lmin represents a minimum processing size of the mask in the direction along the intersection line, and Lpd represents a width of the photoelectric converter in a channel length direction.

8. The method according to claim 3, further comprising:
    an etching step of etching a gate material layer constituted by a material of the gate before said simultaneous ion implantation step,
    wherein a mask used in said simultaneous ion implantation step includes all or part of a mask used in said etching step.

* * * * *